(12) United States Patent
Kim et al.

(10) Patent No.: US 12,057,509 B2
(45) Date of Patent: Aug. 6, 2024

(54) THIN FILM TRANSISTOR ARRAY PANEL

(71) Applicant: Samsung Display Co., Ltd., Yongin-si (KR)

(72) Inventors: Do Hyung Kim, Yongin-si (KR); Gun Hee Kim, Hwaseong-si (KR); Hyeon Sik Kim, Yongin-si (KR); Sang Ho Park, Hwaseong-si (KR); Joo Hee Jeon, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/544,353

(22) Filed: Dec. 7, 2021

(65) Prior Publication Data

US 2022/0093804 A1   Mar. 24, 2022

Related U.S. Application Data

(62) Division of application No. 16/354,396, filed on Mar. 15, 2019, now Pat. No. 11,217,696.

(30) Foreign Application Priority Data

Mar. 22, 2018   (KR) .................. 10-2018-0033404

(51) Int. Cl.
*H01L 29/78* (2006.01)
*H01L 29/08* (2006.01)
(Continued)

(52) U.S. Cl.
CPC .... *H01L 29/78621* (2013.01); *H01L 29/0847* (2013.01); *H01L 29/41733* (2013.01);
(Continued)

(58) Field of Classification Search
CPC ............... H01L 29/0847; H01L 29/78621
See application file for complete search history.

(56) References Cited

U.S. PATENT DOCUMENTS

| 6,534,788 B1 * | 3/2003 | Yeo ................. H01L 29/78648 |
| | | 257/66 |
| 9,502,486 B2 | 11/2016 | Lee et al. |

(Continued)

FOREIGN PATENT DOCUMENTS

| JP | 2000-315797 | 11/2000 |
| JP | 2003-17502 | 1/2003 |

(Continued)

OTHER PUBLICATIONS

Korean Office Action for Korean Patent Application or Patent No. 10-2018-0033404, dated Dec. 9, 2022.

*Primary Examiner* — Trang Q Tran
(74) *Attorney, Agent, or Firm* — KILE PARK REED & HOUTTEMAN PLLC

(57) ABSTRACT

A thin film transistor array panel includes a substrate, a first gate electrode on the substrate, a semiconductor layer on the first gate electrode, the semiconductor layer including a drain region, a source region, a lightly doped drain (LDD) region, and a channel region, a second gate electrode on the semiconductor layer, the first gate electrode and the second gate electrode each overlapping the channel region, a control gate electrode that overlaps the LDD region, and a source electrode and a drain electrode respectively connected with the source region and the drain region of the semiconductor layer.

14 Claims, 12 Drawing Sheets

(51) Int. Cl.
*H01L 29/417* (2006.01)
*H01L 29/786* (2006.01)
*H10K 59/121* (2023.01)

(52) U.S. Cl.
CPC .... *H01L 29/78648* (2013.01); *H01L 29/7869* (2013.01); *H10K 59/1213* (2023.02)

(56) References Cited

U.S. PATENT DOCUMENTS

| | | |
|---|---|---|
| 2007/0170506 A1 | 7/2007 | Onogi et al. |
| 2012/0146043 A1 | 6/2012 | Kitakado et al. |
| 2016/0049523 A1 | 2/2016 | Yamada |
| 2016/0093647 A1* | 3/2016 | Kim .................. H01L 27/1255 257/40 |
| 2016/0365430 A1 | 12/2016 | Zuo et al. |
| 2017/0047348 A1 | 2/2017 | Abe et al. |

FOREIGN PATENT DOCUMENTS

| | | |
|---|---|---|
| JP | 2005-79283 | 3/2005 |
| JP | 5468612 | 4/2014 |
| KR | 10-1117739 | 2/2012 |
| KR | 10-2017-0045781 | 4/2017 |

\* cited by examiner

FIG. 2A

THIN FILM TRANSISTOR ARRAY PANEL

CROSS-REFERENCE TO RELATED APPLICATION(S)

This is a divisional application of U.S. patent application Ser. No. 16/354,396, filed Mar. 15, 2019 (now U.S. Pat. No. 11,217,696), the disclosure of which is incorporated herein by reference in its entirety. U.S. patent application Ser. No. 16/354,396 claims priority to and benefit of Korean Patent Application No. 10-2018-0033404 under 35 U.S.C. § 119, filed on Mar. 22, 2018, in the Korean Intellectual Property Office, the entire contents of which are incorporated herein by reference.

BACKGROUND

1. Field

Embodiments relate to a thin film transistor array panel.

2. Description of the Related Art

Various display devices such as a liquid crystal display and an organic light emitting diode display device include and are driven by a thin film transistor.

For example, according to a driving method of the organic light emitting diode display, two electrodes and an organic emission layer between the two electrodes are included, and electrons injected from one electrode and holes injected from the other electrode are combined in the organic emission layer, thereby forming excitons, and the organic emission layer emits light while the excitons emit energy.

The above information disclosed in this Background section is only for enhancement of understanding of the background of the invention and therefore it may contain information that does not form the prior art that is already known in this country to a person of ordinary skill in the art.

SUMMARY

Embodiments are directed to a thin film transistor array panel, including a substrate, a first gate electrode on the substrate, a semiconductor layer on the first gate electrode, the semiconductor layer including a drain region, a source region, a lightly doped drain (LDD) region, and a channel region, a second gate electrode on the semiconductor layer, the first gate electrode and the second gate electrode each overlapping the channel region, a control gate electrode that overlaps the LDD region, and a source electrode and a drain electrode respectively connected with the source region and the drain region of the semiconductor layer.

The control gate electrode may include a first drain control gate electrode, a second drain control gate electrode, a first source control gate electrode, and a second source control gate electrode, the first drain control gate electrode and the first source control gate electrode may be on the same layer as the first gate electrode, and the second drain control gate electrode and the second source control gate electrode may be on the same layer as the second gate electrode.

The control gate electrode may include a drain control gate electrode and a source control gate electrode, and the drain control gate electrode and the source control gate electrode may be on the same layer.

The control gate electrode may include a drain control gate electrode and a source control gate electrode, one of the drain control gate electrode or the source control gate electrode may be on the same layer as the first gate electrode, and the other one of the drain control gate electrode and the source control gate electrode may be on the same layer as the second gate electrode.

The control gate electrode may include a first control gate electrode and a second control gate electrode, and the first control gate electrode and the second control gate electrode may respectively overlap above and below the LDD region.

The thin film transistor array panel may further include a first insulation layer between the first gate electrode and the semiconductor layer, a second insulation layer between the semiconductor layer and the second gate electrode, and a third insulation layer on the semiconductor layer.

The source region and drain region may be doped with a P-type impurity.

When a voltage applied to the first gate electrode and the second gate electrode is higher than a predetermined voltage, the drain control gate electrode and the source control gate electrode may be independently applied with a positive voltage.

When a voltage applied to the first gate electrode and the second gate electrode is lower than a predetermined voltage, the drain control gate electrode and the source control gate electrode may be independently applied with a negative voltage.

Embodiments are also directed to a thin film transistor array panel, including a substrate, a gate electrode on the substrate, a control gate electrode on a same layer as the gate electrode, a semiconductor layer, the semiconductor layer including a channel that overlaps the gate electrode, a LDD region that overlaps the control gate electrode, a source region, and a drain region, and a source electrode and a drain electrode connected with the semiconductor layer.

The thin film transistor array panel may further include a first insulation layer between the gate electrode and the semiconductor layer, and a second insulation layer on the semiconductor layer.

The thin film transistor array panel may further include a first insulation layer between the semiconductor layer and the gate electrode, and a second insulation layer on the gate electrode.

The source region and the drain region of the semiconductor layer may be doped with a P-type impurity.

When a voltage applied to the gate electrode is higher than a predetermined voltage, the drain control gate electrode and the source control gate electrode may be independently applied with a positive voltage.

When a voltage applied to the gate electrode is lower than a predetermined voltage, the drain control gate electrode and the source control gate electrode may be independently applied with a negative voltage.

Embodiments are also directed to a thin film transistor array panel, including a substrate, a gate electrode on the substrate, a semiconductor layer on the gate electrode, the semiconductor layer including a source region, a drain region, and a channel region, a control gate electrode on the semiconductor layer, the control gate electrode not overlapping the gate electrode, and a source electrode and a drain electrode connected with the semiconductor layer.

The thin film transistor array panel may further include a first insulation layer between the gate electrode and the semiconductor layer, and a second insulation layer between the semiconductor layer and the control gate electrode.

When a voltage applied to the gate electrode is higher than a predetermined voltage, the control gate electrode may be applied with a positive voltage.

When a voltage applied to the gate electrode is lower than a predetermined voltage, the control gate electrode may be applied with a negative voltage.

BRIEF DESCRIPTION OF THE DRAWINGS

Features will become apparent to those of skill in the art by describing in detail example embodiments with reference to the attached drawings in which:

FIG. 2A to FIG. 2C illustrate schematic cross-sectional views of a channel region when a voltage is applied to the thin film transistor according to the present example embodiment.

DETAILED DESCRIPTION

Figure 1:
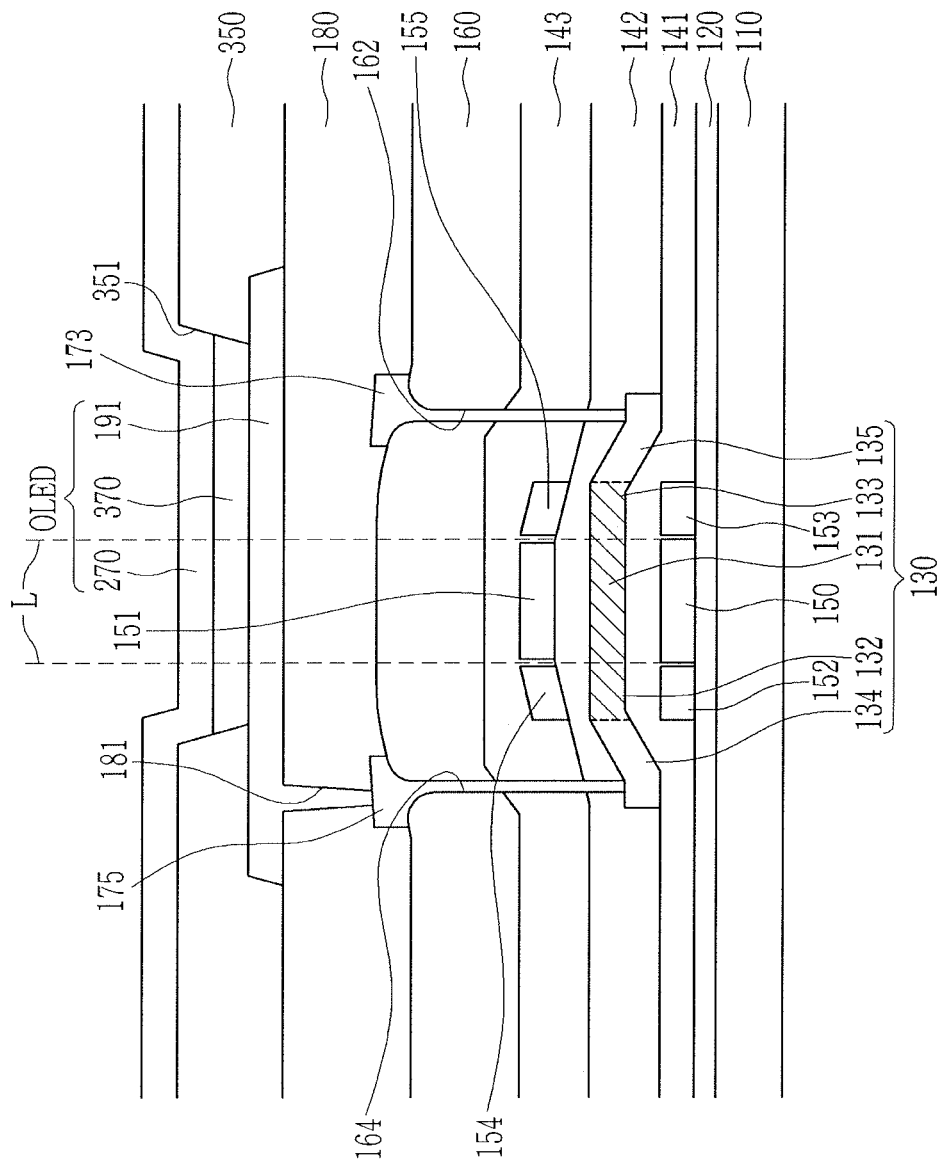
FIG. 1 illustrates a cross-sectional view of an organic light emitting diode display device according to an example embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey example implementations to those skilled in the art. In the drawing figures, the dimensions of layers and regions may be exaggerated for clarity of illustration. Like reference numerals refer to like elements throughout.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, throughout the specification, the word "on" a target element will be understood to mean positioned above or below the target element, and is not necessarily understood to mean positioned "at an upper side" based on a direction opposite to a gravity direction.

In addition, unless explicitly described to the contrary, the word "comprise" and variations such as "comprises" or "comprising" will be understood to imply the inclusion of stated elements but not the exclusion of any other elements.

Further, throughout the specification, the phrase "on a plane" means viewing a target portion from the top, and the phrase "on a cross-section" means viewing a cross-section formed by vertically cutting a target portion from the side.

FIG. 1 illustrates a cross-sectional view of an organic light emitting diode (OLED) display device according to an example embodiment.

Referring to FIG. 1, an OLED display according to the present example embodiment includes a substrate 110, a buffer layer 120, a first gate electrode 150, a first drain control gate electrode 152, a first source control gate electrode 153, a first insulation layer 141, a semiconductor layer 130, a second insulation layer 142, a second gate electrode 151, a second drain control gate electrode 154, a second source control gate electrode 155, a third insulation layer 143, an interlayer insulating layer 160, a drain electrode 175, and a source electrode 173, and further includes a passivation layer 180, a pixel electrode 191, a barrier rib 350, an organic emission layer 370, and a common electrode 270.

The buffer layer 120 may be disposed on the substrate 110, and the first gate electrode 150, the first drain control gate electrode 152, and the first source control gate electrode 153 may be disposed on the buffer layer 120. The first insulation layer 141 may be disposed on a layer that includes the first gate electrode 150, and the semiconductor layer 130 may be disposed on the first insulation layer 141. The second gate electrode 151, the second drain control gate electrode 154, and the second source control gate electrode 155 may be disposed on the semiconductor layer 130, and the third insulation layer 143 may be disposed on a layer that includes the second gate electrode 151.

The interlayer insulating layer 160 may be disposed on the third insulation layer 143, and the source electrode 173 and the drain electrode 175 may be disposed on the interlayer insulating layer 160.

In addition, the pixel electrode 191 may be disposed on the source electrode 173 and the drain electrode 175, the passivation layer 180 may be disposed between the source electrode 173 and drain electrode 175 and the pixel electrode 191, and the barrier rib 350, the organic emission layer 370, and the common electrode 270 may be sequentially disposed on the pixel electrode 191.

The substrate 110 may be provided as an insulating substrate 110 made of glass, quartz, ceramic, and the like. In another implementation, and the substrate 110 may be made of stainless steel or a flexible plastic material such as a polyimide film for a flexible display.

The buffer layer 120 may be disposed on the substrate 110, and may be made of a silicon nitride (SiNx) or a silicon oxide (SiOx). The buffer layer 120 may planarize a top surface and help prevent permeation of an impurity.

The first gate electrode 150 may be disposed on the buffer layer 120, and may be provided as a single layer or a multiple layer made of copper (Cu), molybdenum (Mo), aluminum (Al), titanium (Ti), and the like. In addition, the first drain control gate electrode 152 and the first source control gate electrode 153 may be disposed on the same layer as the first gate electrode 150, and like the first gate electrode 150, they may be provided as a multiple player or a single layer made of copper (Cu), molybdenum (Mo), aluminum (Al), titanium (Ti), and the like.

The first gate electrode 150 may be disposed between the first drain control gate electrode 152 and the first source control gate electrode 153. The first gate electrode 150 may be independently disposed at a distance from the first source control gate electrode 153 and the first drain control gate electrode 152, which are disposed at opposite sides of the first gate electrode 150.

Voltages, each having a different polarity, may be independently applied to the first gate electrode 150, the first drain control gate electrode 152, and the source control gate electrode 153.

The first insulation layer 141 may be disposed on a layer where the first gate electrode 150, the first drain control gate electrode 152, and the first source control gate electrode 153 are formed, and may cover the buffer layer 120, the first gate electrode 150, the first drain control gate electrode 152, and the first source control gate electrode 153. The first insulation layer 141 may include a silicon nitride (SiNx) or a silicon oxide (SiOx).

In example embodiments, the buffer layer 120 may be omitted, and in this case, the first gate electrode 150 may be disposed on the substrate 110, and the first insulation layer 140 may be disposed on a layer that includes the first gate electrode 150, the first drain control gate electrode 152, and the first source control gate electrode 153. In this case, the first insulation layer 141 may be provided for insulation between conductive electrodes, and may replace the buffer layer 120 of silicon nitride (SiNx) or silicon oxide (SiOx) material.

The semiconductor layer 130 may be disposed on the first insulation layer 141, and may include a polycrystalline silicon, an oxide semiconductor material, an amorphous silicon, and the like. For example, the semiconductor layer 130 may include an oxide of a material selected from a metallic element such as indium (In), zinc (Zn), gallium (Ga), tin (Sn), germanium (Ge), and the like, and a combination thereof. In addition, the semiconductor layer 130 may be partitioned by being doped with an impurity.

The semiconductor layer 130 may include a channel region 131 that is not doped with an impurity, a source region 135 doped with an impurity, a drain region 134 doped with an impurity, and a lightly doped drain (LDD) region having a higher resistance value than the source region 135 and the drain region 134 and being lightly doped with an impurity.

The lightly doped drain (LDD) may include a first LDD region 132 formed between the channel region 131 and the drain region 134 of the semiconductor layer 130, and a second LDD region 133 formed between the channel region 131 and the source region 135 of the semiconductor layer 130.

The channel region 131 of the semiconductor layer 130 may be formed to overlap the first gate electrode 150 disposed therebelow, and the first drain control gate electrode 152 and the first source control gate electrode 153 may be formed to respectively overlap the first LDD region 132 and the second LDD region 133 disposed therebelow. The first drain control gate electrode 152 and the first source control gate electrode 153 may be disposed to overlap the first LDD region 132 and the second LDD region 133 respectively disposed therebelow so as to be disposed within the first LDD region 132 and the second LDD region 133.

Conductivity of the LDD regions may be a middle level of conductivity of a region that contacts the source electrode 173 and drain electrode 175 and conductivity of the channel region 131. The LDD regions may help prevent occurrence of a leakage current or punch-through of the thin film transistor, and also prevent deterioration of characteristics and reliability of the semiconductor layer 130.

The second insulation layer 142 is disposed on the semiconductor layer 130, while covering the semiconductor layer 130 and the first insulation layer 141, and may include a silicon nitride ($S_iN_x$).

The second gate electrode 151 is disposed on the second insulation layer 142, and may be provided as a single layer or a multiple layer formed of copper (Cu), molybdenum (Mo), aluminum (Al), titanium (Ti), and the like.

In addition, the second drain control gate electrode 154 and the second source control gate electrode 155 may be disposed on the same layer as the second gate electrode 151, and like the second gate electrode 151, may be provided as a single layer or a multiple layer formed of copper (Cu), molybdenum (Mo), aluminum (Al), titanium (Ti), and the like.

The second gate electrode 151 may be disposed between the second drain control gate electrode 154 and the second source control gate electrode 155. The second gate electrode 151 may be separate from and disposed at a distance from the second source control gate electrode 154 and the second drain control gate electrode 155, which are disposed at opposite sides of the second gate electrode 151. The second gate electrode 151, the second drain control gate electrode 154, and the source control gate electrode 155 may be respectively applied with voltages that are different in polarity.

The second gate electrode 151 may overlap the first gate electrode 150 and the channel region 131 of the semiconductor layer 130. The second drain control gate electrode 154 may overlap the first LDD region 132, and the second source control gate electrode 155 may overlap the second LDD region 133.

Thus, the first LDD region 132 may be interposed between the second drain control gate electrode 154 and the first drain control gate electrode 152 while overlapping the second drain control gate electrode 154 and the first drain control gate electrode 152. The first drain control gate electrode 152 and the second drain control gate electrode 154 may be disposed in the first LDD region 132 and may be different in width. The second LDD region 133 may be disposed between the first source control gate electrode 153 and the second source control gate electrode 155, while overlapping the first source control gate electrode 153 and the second source control gate electrode 155.

A virtual reference line extending perpendicularly to a top surface of the substrate 110 and passing an inner boundary of the first LDD region 132 may not intersect the second drain control gate electrode 154. Thus, in an example embodiment, the second drain control gate electrode 154 overlaps the first LDD region 132, and does not contact or overlap other semiconductor layers. Thus, the drain and source control gate electrodes may control only the respective LDD regions without affecting other peripheral regions, which may help prevent deterioration of characteristics of the thin film transistor.

Hereinafter, the first drain control gate electrode 152, the first source control gate electrode 153, the second drain control gate electrode 154, and the second source control gate electrode 155 may be referred to together as respective control gate electrodes, for example, a first control gate electrode that includes the first drain control gate electrode 152 and the first source control gate electrode 153, and a second control gate electrode that includes the second drain control gate electrode 154 and the second source control gate electrode 155.

The third insulation layer 143 may be disposed on the second gate electrode 151, the second drain control gate electrode 154, and the second source control gate electrode 155, and may cover the second gate electrode 151, the second drain control gate electrode 154, the second source control gate electrode 155, and the second insulation layer 142. The third insulation layer 143 may be formed of a material that includes a silicon nitride ($S_iN_x$).

The interlayer insulating layer 160 may be disposed on the third insulation layer 143, and contact holes 162 and 164 that expose at least a part of the semiconductor layer 130 may be formed to penetrate the second insulation layer 142, the third insulation layer 143, and the interlayer insulating layer 160, such that the contact holes 162 and 164 expose the drain region 134 and the source region 135 of the semiconductor layer 130.

The source electrode 173 and the drain electrode 175 may be disposed on the interlayer insulating layer 160. The source electrode 173 may be connected with the source region 135 of the semiconductor layer 130 through the contact hole 162, and the drain electrode 175 may be connected with the drain region 134 of the semiconductor layer 130 through the contact hole 164.

The semiconductor layer 130, the first gate electrode 150, the first drain control gate electrode 152, the first source control gate electrode 153, the second gate electrode 151, the second drain control gate electrode 154, the second source control gate electrode 155, the source electrode 173, and the drain electrode 175 form a single thin film transistor. The above-described thin film transistor may be one of, for example, a switching transistor, a driving transistor, and a compensation transistor that are disposed in a pixel of an organic light emitting diode display. The substrate 110 having the thin film transistors formed thereon may be referred to as a thin film transistor array panel. When an organic light emitting diode is further provided in the thin film transistor array panel, an organic light emitting diode display may be formed, and when a liquid crystal layer is further provided, a liquid crystal display may be formed.

The passivation layer 180 may be disposed on the interlayer insulating layer 160 to cover the interlayer insulating layer 160, the source electrode 173, and the drain electrode 175. A contact hole 181 that at least partially exposes the drain electrode 175 may be formed in the passivation layer 180.

The pixel electrode 191 may be disposed on the passivation layer 180. The pixel electrode 191 may be made of a transparent conductive material such as indium-tin oxide (ITO), indium-zinc oxide (IZO), zinc oxide (ZnO), indium oxide ($In_2O_3$), and the like, or a reflective metal such as lithium (Li), calcium (Ca), lithium fluoride/calcium (LiF/Ca), lithium fluoride/aluminum (LiF/Al), aluminum (Al), silver (Ag), magnesium (Mg), gold (Au), and the like. The pixel electrode 191 may be electrically connected with the drain electrode 175 through the contact hole 181 and may be an anode of the organic light emitting diode (OLED).

The barrier rib 350 may be disposed on the passivation layer 180 and an edge portion of the pixel electrode 191. The barrier rib 350 may have an opening 351 that exposes the pixel electrode 191 and may include, for example, a resin such as a polyacrylic or a polyimide and a silica-based inorganic material.

The organic emission layer 370 may be formed in the opening 351 of the barrier rib 350. The organic emission layer 370 may include at least one of an emission layer, a hole injection layer (HIL), a hole transport layer (HTL), an electron transport layer (ETL), and an electron injection layer (EIL).

The common electrode 270 may be formed on the barrier rib 350 and the organic emission layer 370. The common electrode 270 may be formed of a transparent conductive material such as indium-tin oxide (ITO), indium-zinc oxide (IZO), zinc oxide (ZnO), indium oxide ($In_2O_3$), and the like. In an example embodiment, the common electrode 270 may be formed of a reflective metal such as lithium (Li), calcium (Ca), lithium fluoride/calcium (LiF/Ca), lithium fluoride/aluminum (LiF/Al), aluminum (Al), silver (Ag), magnesium (Mg), gold (Au), and the like. The common electrode 270 may be a cathode of the organic light emitting diode (OLED). The pixel electrode 191, the organic emission layer 370, and the common electrode 270 form the organic light emitting diode (OLED).

Figure 2A:
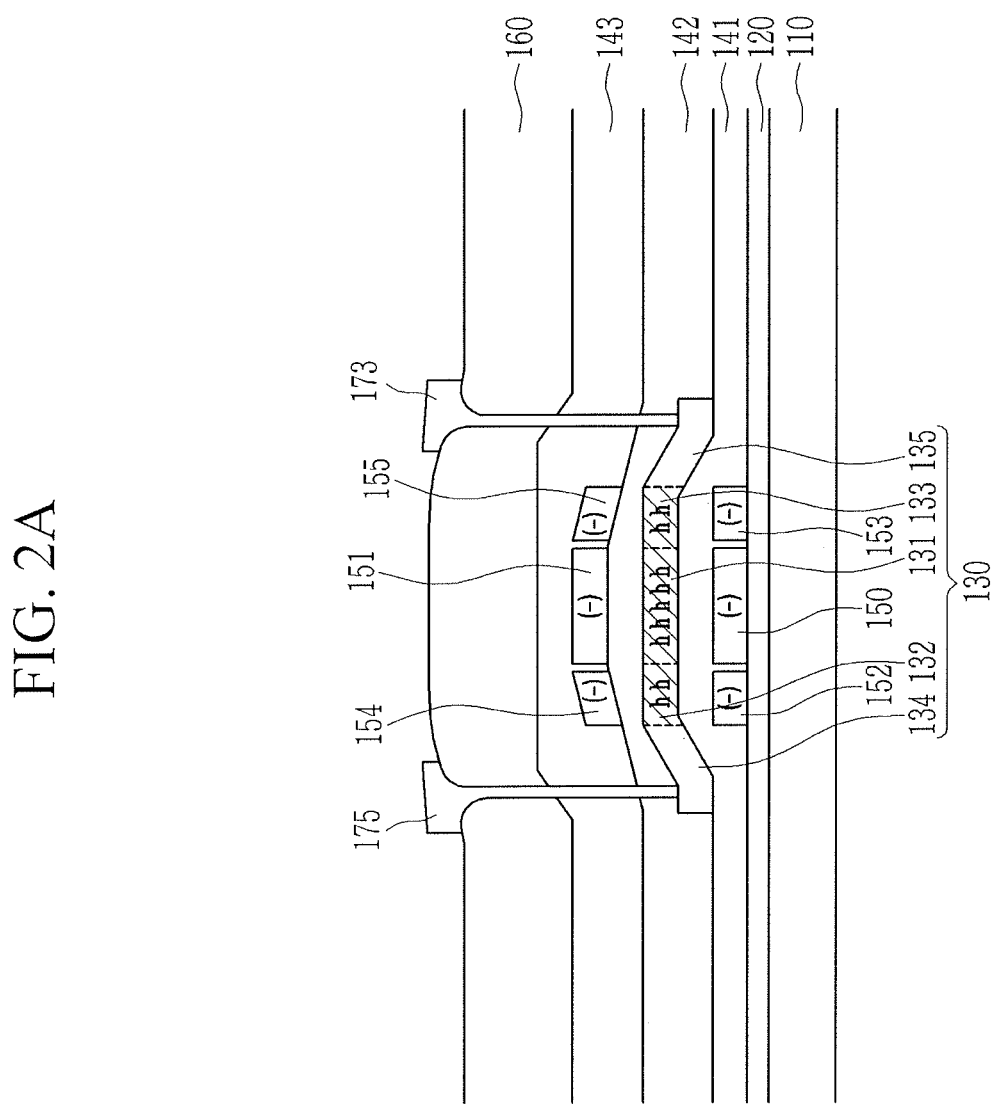
Figure 2B:
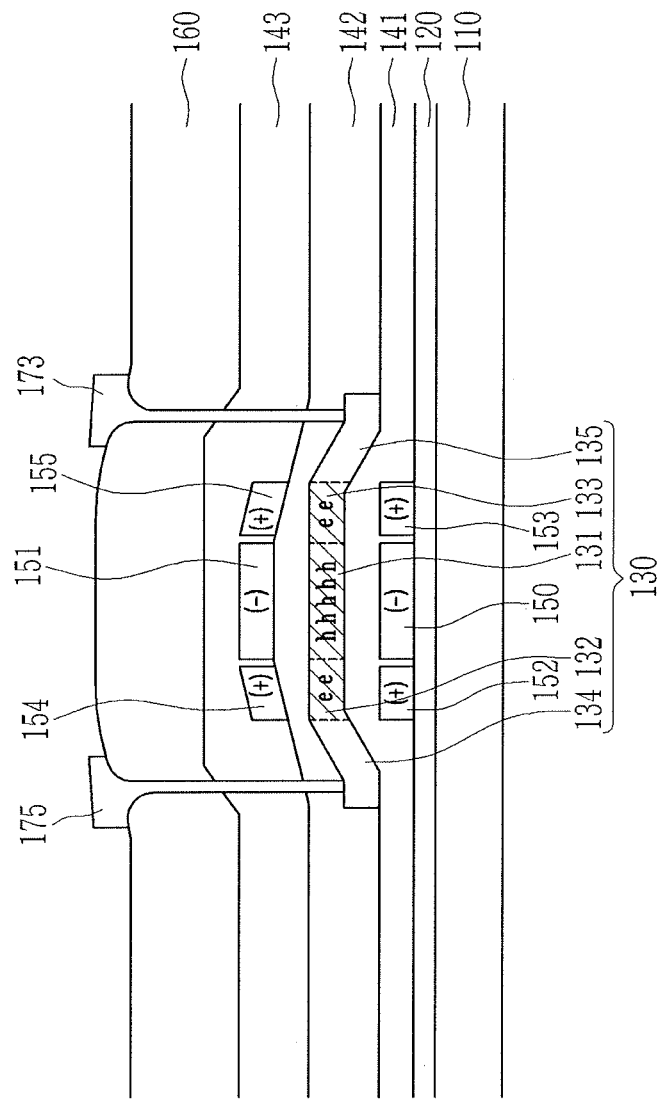
Figure 2C:
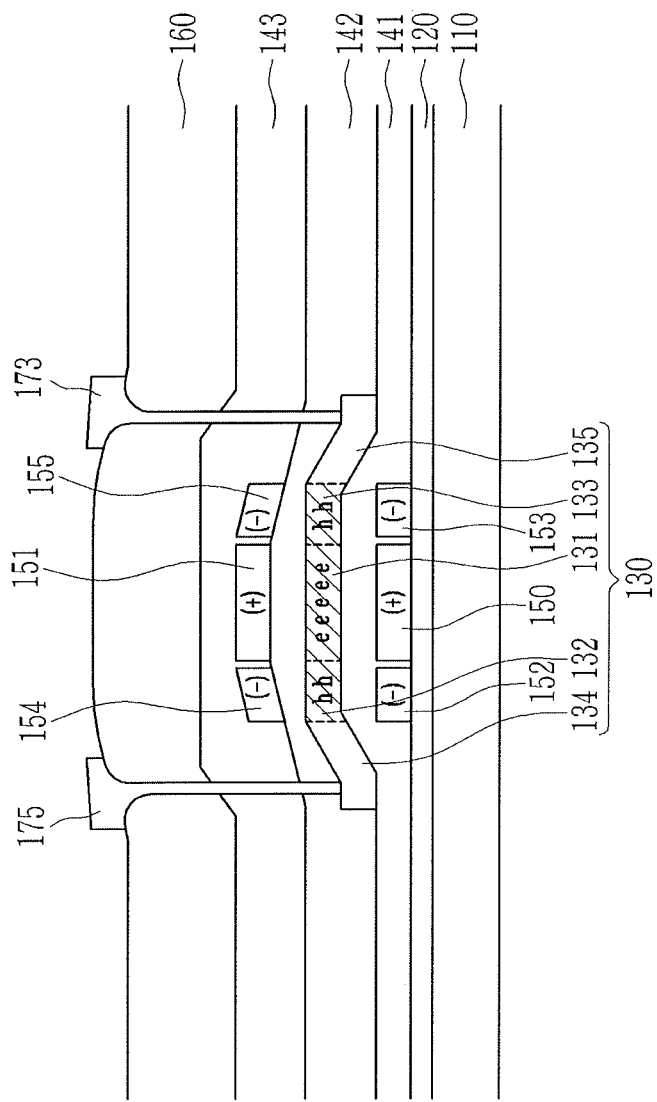

FIG. 2A to FIG. 2C illustrate schematic cross-sectional views of the channel region of the semiconductor layer when a voltage is applied to the thin film transistor according to the present example embodiment.

Hereinafter, a driving method of a P-type thin film transistor according to the present example embodiment will be described with reference to FIG. 2A to FIG. 2C and Table 1.

TABLE 1

| Section | TFT state | Voltage applied to gate electrode | Channel region | Voltage applied to control gate electrode | Lightly doped extrinsic region | Result |
|---|---|---|---|---|---|---|
| i | On | Negative (−) | Hole | Negative (−) | Hole | On current ↑ |
| ii | Off | Negative (−) | Hole | Positive (+) | Electron | Off current ↓ |
| iii | Off | Positive (+) | Electron | Negative (−) | Hole | Off current ↓ |

In Table 1, the section (i) is a section during which the thin film transistor according to the present example embodiment is to be turned on, wherein a negative voltage is applied to the control gate electrode to increase intensity of a current flowing to the thin film transistor.

Specifically, when a negative voltage is applied to the first gate electrode 150 and the second gate electrode 151, the control gate electrodes 152, 153, 154, and 155 may be applied with a negative voltage to form a channel that connects the source region 135 and the drain region 134. A range of a voltage applied to the control gate electrodes 152, 153, 154, and 155 may be between −20 V and −2 V, and a voltage that is the same polarity as the voltage applied to the first gate electrode 150 and the second gate electrode 151 may be applied to the control gate electrodes. This will be described in detail with reference to FIG. 2A.

FIG. 2A illustrates a schematic cross-sectional view of the channel region formed in the thin film transistor when a voltage of the range in section (i) of Table 1 is applied to the thin film transistor according to the present example embodiment.

Referring to FIG. 2A, when a negative voltage is applied to the first gate electrode 150 and the second gate electrode 151 to turn on the thin film transistor according to the present example embodiment, a hole channel having holes is formed in the channel region 131 between the first gate electrode 150 and the second gate electrode 151. Due to the holes formed in the semiconductor layer 130, a drain-source current flows for driving of the thin film transistor.

As shown in FIG. 2A and Table 1, the first drain control gate electrode 152, the first source control gate electrode 153, the second drain control gate electrode 154, and the second source control gate electrode 155 are applied with a negative voltage. When a negative voltage is applied to the drain control gate electrodes 152 and 154 and the source control gate electrodes 153 and 155, only holes remain in the top surfaces of the first LDD region 132 and the second LDD region 133, and thus a channel is formed in the opposite LDD regions 132 and 133 such that the source region 135 and the drain region 134 are connected. Accordingly, a current path through which a driving current flows is formed to a doping region of the semiconductor layer in the channel region 131 so that the current can flow well to the thin film transistor. Here, the negative voltages applied to each of the drain control gate electrodes and the source control gate electrodes may be the same or different.

In section (ii) of Table 1, a voltage applied to the gate electrode according to the present example embodiment is below the threshold voltage Vth, and therefore the voltage becomes a negative voltage. However, substantially, the section (ii) is a turned-off period, and thus a current is to be reduced. Accordingly, a positive voltage is applied to the control gate electrode to reduce a leakage current.

Specifically, a negative voltage may be applied to the first gate electrode 150 and the second gate electrode 151, and a positive voltage may be applied to the control gate electrodes 152,153,154, and 155. A voltage having a range of −2 V to 0 V may be applied to the control gate electrodes 152,153,154, and 155. This will be described in detail with reference to FIG. 2B.

FIG. 2B schematically illustrates the channel region 131 formed in the thin film transistor when a voltage included in a range of (ii) in Table is applied to the thin film transistor according to the present example embodiment.

Referring to FIG. 2B, the first gate electrode 150 and the second gate electrode 151 are maintained with a negative voltage immediately after the thin film transistor is turned off. In this case, a hole channel is still formed in the channel region 131 of the semiconductor layer 130 disposed between the first gate electrode 150 and the second gate electrode 151.

As shown in FIG. 2B, the first drain control gate electrode 152, the first source control gate electrode 153, the second drain control gate electrode 154, and the second source control gate electrode 155 are respectively applied with a positive voltage. When the drain control gate electrodes 152 and 154 and the source control gate electrodes 153 and 155 are applied with the positive voltage, electrons are gathered on an upper surface of the first LDD region 132 and the second LDD region 133, thereby forming an electron channel.

A negative electric field is applied in the first LDD region 132 due to the gathered electrons, and the channel region 131 through which a driving current can flow to the thin film transistor is not connected to the source region 135 and the drain region 134 such that no current flows. Although the LDD regions 132 and 133 exist, a connection to the source region 135 and the drain region 134 is weak if a hole channel is not provided, and accordingly, a relatively small amount of current flows.

Section (iii) in Table 1 shows a state during which the thin film transistor according to the present example embodiment is to be turned off, and thus no current should flow to the thin film transistor. Accordingly, a negative voltage is applied to the control gate electrode.

Specifically, a positive voltage may be applied to the first gate electrode 150 and the second gate electrode 151, and a negative voltage may be applied to the control gate electrodes 152,153,154, and 155. The voltage applied to the control gate electrodes 152, 153, 154, and 155 may have a range of −20 V to −2 V. This will be described in detail with reference to FIG. 2C.

FIG. 2C is a schematic cross-sectional view of the channel region 131 formed in the thin film transistor when a voltage of the range in section (iii) of Table 1 is applied to the thin film transistor according to the present example embodiment.

Referring to FIG. 2C, in order to turn off the thin film transistor according to the present example embodiment, a positive voltage is applied to the first gate electrode 150 and the second gate electrode 151, and electrons are gathered in the channel region 131 of the semiconductor layer 130 disposed between the first gate electrode 150 and the second gate electrode 151.

When a drain voltage is a low negative voltage, a strong electric field is introduced at a boundary between the channel region 131 and the drain region 134 of the semiconductor layer 130. The electrons gathered on the upper portion of the channel region 131 flow to the source region 135 by the electric field introduced at the boundary by the drain voltage, and accordingly a leakage current that flows to the drain region 134 from the source region 135 may occur. However, in the thin film transistor according to the present example embodiment, the first drain control gate electrode 152, the first source control gate electrode 153, the second drain control gate electrode 154, and the second source control gate electrode 155 are respectively applied with a negative voltage. Accordingly, only holes remain in the first LDD region 132 and the second LDD region 133, and thus electron flow in the channel region 131 is interrupted such that the leakage current flowing to the drain region 134 from the source region 135 does not flow.

The thin film transistor according to the present example embodiment is described as a P type of transistor for an example. A similar operation mechanism is applicable to an N type of thin film transistor reflecting the channel region formed therein.

In contrast to the P-type thin film transistor, a threshold voltage Vth of the N-type thin film transistor is a positive voltage. In order to turn off the N-type thin film transistor, a negative voltage is applied to the first gate electrode 150 and the second gate electrode 151, and holes are gathered on an upper portion of the channel region 131. Accordingly, a positive voltage may be applied to the control gate electrode to increase electron concentration of the LDD regions.

A turn-on current is increased even in driving by the N-type thin film transistor and a leakage current is reduced when the transistor is turned off, and accordingly, the effect in case of using the N-type thin film transistor is also the same as the effect in case of using the P-type thin film transistor.

Figure 3:
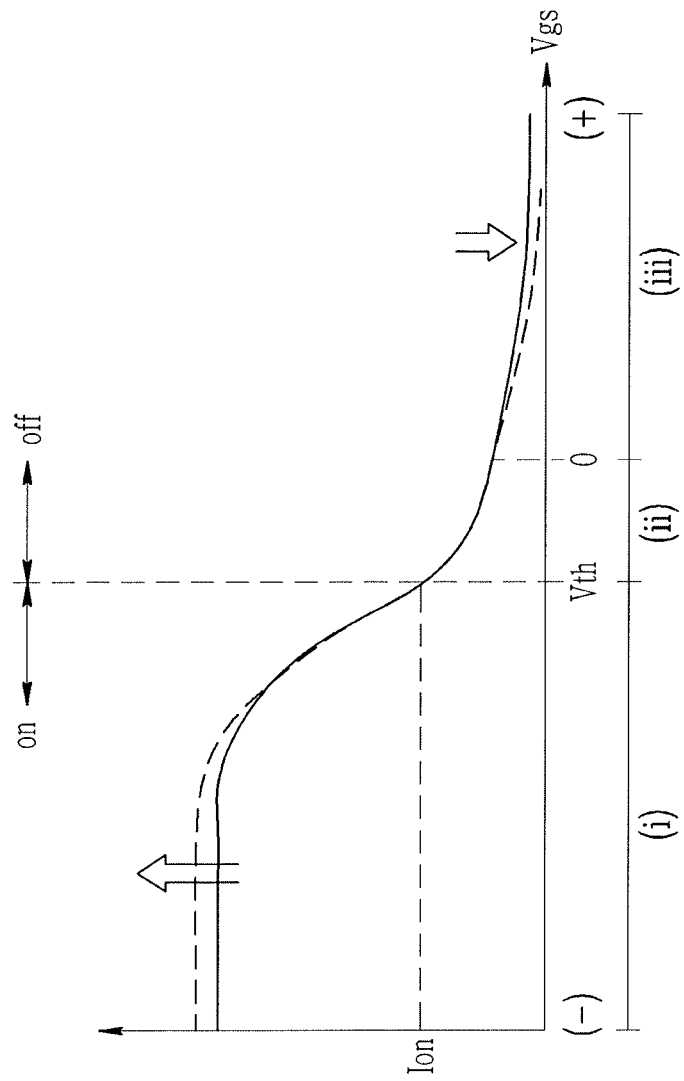
FIG. 3 illustrates a driving voltage-current characteristic graph of the thin film transistor according to the present example embodiment and a thin film transistor of a comparative example.

FIG. 3 is a graph that shows a driving voltage-current characteristic of a thin film transistor according to an example embodiment and a thin film transistor of a comparative example.

In the graph shown in FIG. 3, the solid line shows a voltage-current curve when a P-type thin film transistor of the comparative example is turned on and turned off, and the dashed line shows a voltage-current curve when the P-type thin film transistor according to an example embodiment. The operation characteristic graph shown in FIG. 3 is similarly applicable to an N type thin film transistor.

Here, the P-type thin film transistor of the comparative example has a structure that does not include a control gate electrode.

As shown in Table 1, a driving region of the P-type thin film transistor according to the comparative example and a driving region of the P-type thin film transistor according to the present example embodiment include: section (i) during which the thin film transistor is turned on when the gate-source voltage (Vgs) applied to the first gate electrode 150 and the second gate electrode 151 is lower than the threshold voltage (Vth); section (ii) when the gate-source voltage (Vgs) is between the threshold voltage (Vth) and zero; and section (iii) during which the thin film transistor is turned off when the gate-source voltage (Vgs) is greater than zero.

The thin film transistor of the example embodiment is a P-type thin film transistor; thus, a drain current is increased as the gate-source voltage (Vgs) is decreased. When the gate-source voltage (Vgs) is over about 0.5 V, the thin film transistor is turned off.

Table 2 shows a driving method of the P-type thin film transistor of the comparative example.

TABLE 2

| Section | TFT state | Voltage applied to gate electrode | Channel region | Lightly doped extrinsic region | Result |
| --- | --- | --- | --- | --- | --- |
| i | On | Negative (−) | Hole | Hole | On current ↑ |
| ii | Off | Negative (−) | Hole | Hole | Off current ↓ |
| iii | Off | Positive (+) | Electron | Hole | Off current ↓ |

Since the P-type thin film transistor of the comparative example does not include a control gate electrode, a hole channel remains in the LDD regions by the already-doped P-type impurity. Accordingly, an on current and an off current of the comparative example maintain the same intensity of the current according to a conventional thin film transistor characteristic.

Referring to Table 1 and Table 2, a current that flows during the section (i) is increased, and is more reduced in the sections (ii) and (iii), in the thin film transistor of the example embodiment compared to the thin film transistor of the comparative example.

Figure 4:
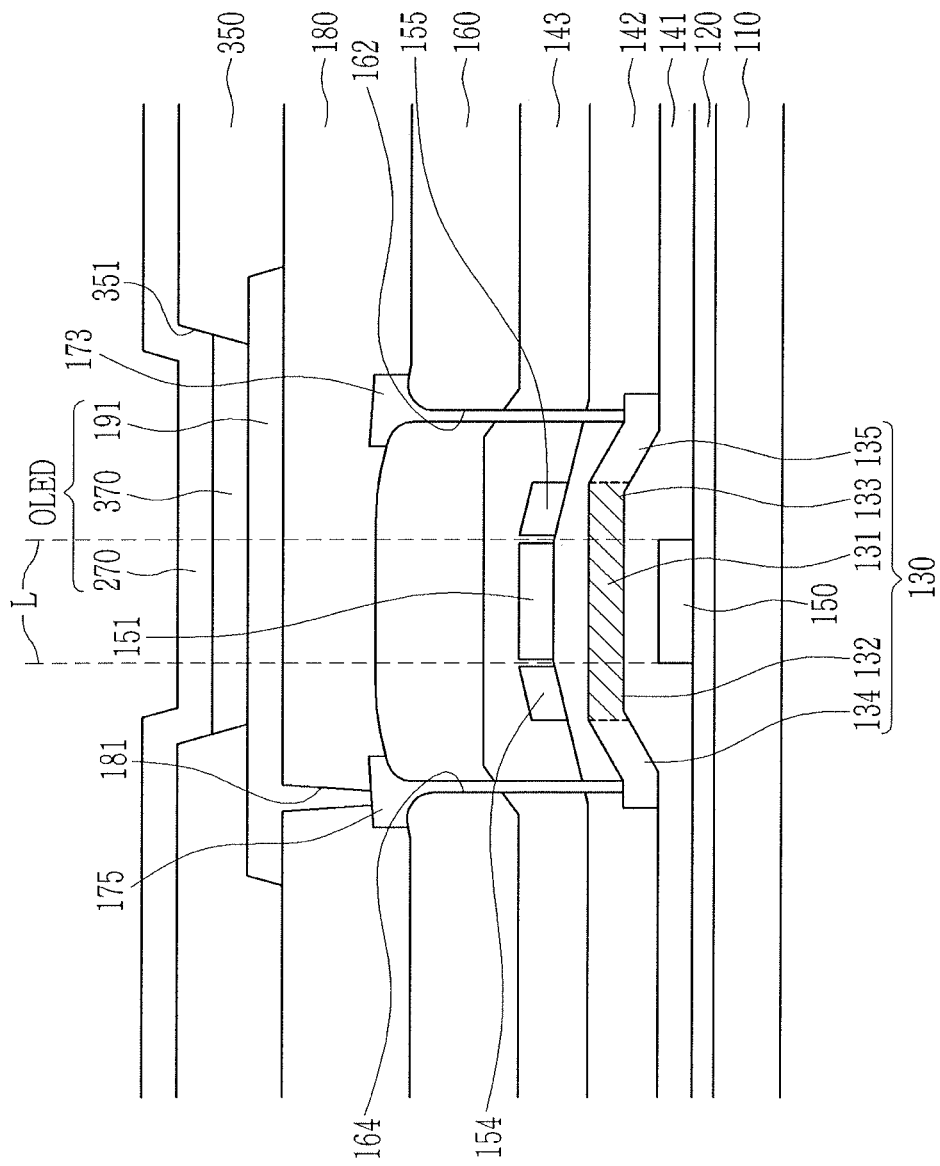
FIG. 4 illustrates a cross-sectional view of an organic light emitting diode display device according to another example embodiment.

FIG. 4 illustrates a cross-sectional view of an organic light emitting diode display according to another example embodiment.

Referring to FIG. 4, an organic light emitting diode display according to the present example embodiment includes a substrate 110, a buffer layer 120, a first gate electrode 150, a first insulation layer 141, a semiconductor layer 130, a second insulation layer 142, a second gate electrode 151, a second source control gate electrode 155, the second drain control gate electrode 154, a third insulation layer 143, an interlayer insulating layer 160, a drain electrode 175, a source electrode 173, a passivation layer 180, a pixel electrode 191, a barrier rib 350, an organic emission layer 370, and a common electrode 270.

Here, the substrate 110, the buffer layer 120, the first gate electrode 150, the first insulation layer 141, the semiconductor layer 130, the second insulation layer 142, the third insulation layer 143, the interlayer insulating layer 160, the drain electrode 175, and the source electrode 173 respectively correspond to the substrate 110, the buffer layer 120, the first gate electrode 150, the first insulation layer 141, the semiconductor layer 130, the second insulation layer 142, the third insulation layer 143, the interlayer insulating layer 160, the drain electrode 175, and the source electrode 173 of FIG. 1, and thus only differences will be mainly described.

The organic light emitting diode display shown in FIG. 4 does not include a first drain control gate electrode 152 and the first source control gate electrode 153 compared to the cross-sectional view of FIG. 1, and the second drain control gate electrode 154 and a second source control gate electrode 155 may be formed on the same layer at opposite sides of the second gate electrode 151.

A virtual extension line extending perpendicularly from the top surface of the substrate 110 and passing an inner boundary of a LDD region may not intersect the second drain control gate electrode 154 or the second source control gate electrode 155.

In the present example embodiment, only the first LDD region 132 is disposed below the second drain control gate electrode 154, while overlapping the second drain control gate electrode 154, and only the second LDD region 133 is disposed below the second source control gate electrode 155, while overlapping the second source control gate electrode 155, such that the control gate electrodes do not overlap another region of the semiconductor layer. As a result, the drain control gate electrode 154 and the source control gate electrode 155 may control only the LDD regions, while not affecting other peripheral areas, which may improve a characteristic of the thin film transistor.

According to the present example embodiment, the source control gate electrode and the drain control gate electrode are additionally formed to reduce a leakage current, and therefore, an effect of a thin film transistor according to an example embodiment will be observed when the thin film transistor is driven according to the above-described section (iii) of FIG. 3.

For example, referring again to FIG. 3, a positive voltage is applied to a first gate electrode 150 and a second gate electrode 151 to turn off the thin film transistor according to the present example embodiment, and electrons are gathered in a channel region 131 of a semiconductor layer 130 that is disposed between the first gate electrode 150 and the second gate electrode 151. In this case, a leakage current that flows to a drain region 134 from a source region 135 may occur, and thus a negative voltage may be applied to the second drain control gate electrode 154 and a second source control gate electrode 155 as shown in FIG. 4.

Accordingly, only holes remain in the first LDD region 132 and a second LDD region 131, and thus electron flow of the channel region 131 is interrupted such that no leakage current flowing to the drain region 134 from the source region 135 occurs.

In the thin film transistor of FIG. 4, the negative voltage is applied only to a single drain control gate electrode and a single source control gate electrode unlike the structure shown in FIG. 2C, and thus intensity of a current that can be controlled according to the present example embodiment may be lower than intensity of the leakage current that can be controlled according to the present example embodiment of FIG. 2C.

Figure 5:
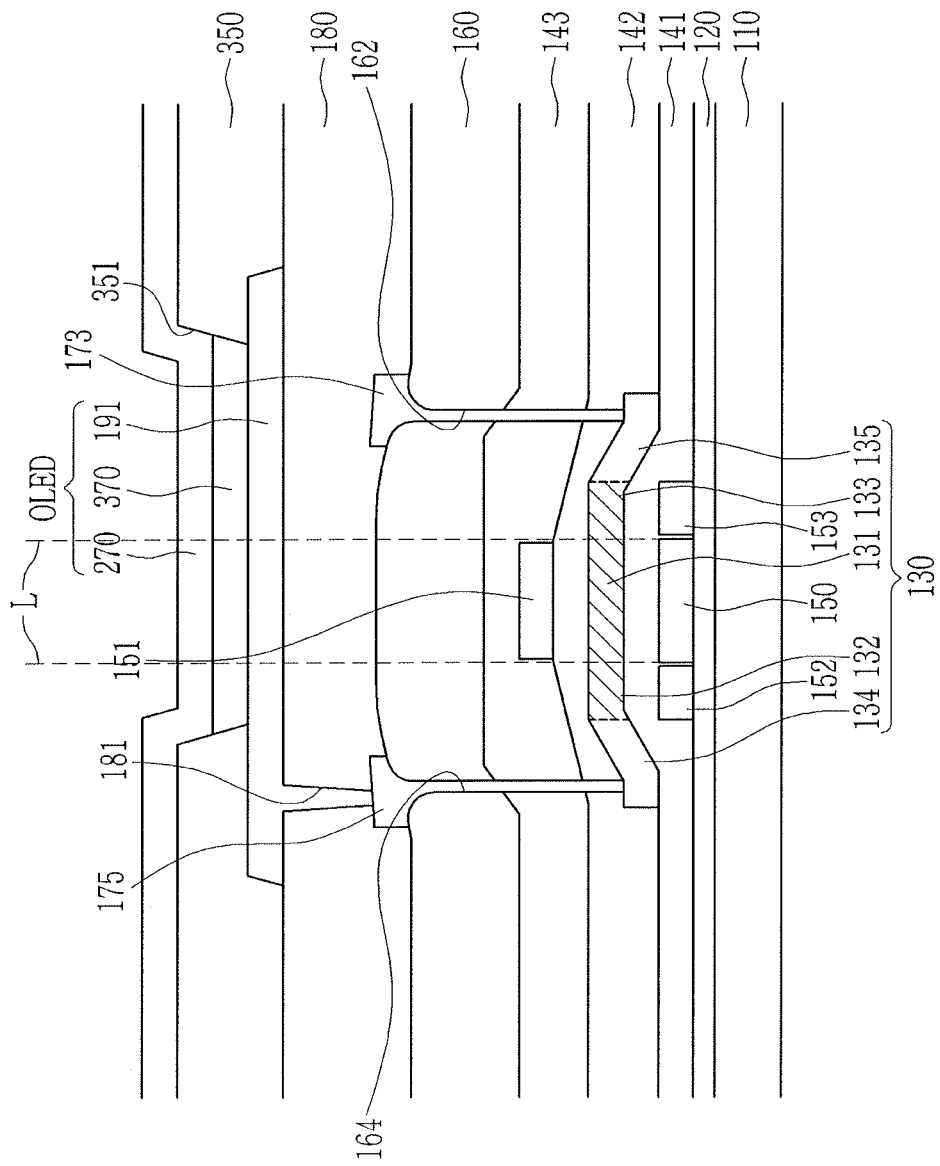
FIG. 5 illustrates a cross-sectional view of an organic light emitting diode display device according to another example embodiment.

FIG. 5 illustrates a cross-sectional view of an organic light emitting diode display according to another example embodiment.

Referring to FIG. 5, an organic light emitting diode display according to the present example embodiment includes a substrate 110, a buffer layer 120, a first gate electrode 150, the first source control gate electrode 153, a first drain control gate electrode 152, a first insulation layer 141, a semiconductor layer 130, a second insulation layer 142, a second gate electrode 151, a third insulation layer 143, an interlayer insulating layer 160, a drain electrode 175, a source electrode 173, a passivation layer 180, a pixel electrode 191, a barrier rib 350, an organic emission layer 370, and a common electrode 270.

Here, the substrate 110, the buffer layer 120, the first gate electrode 150, the first insulation layer 141, the semiconductor layer 130, the second insulation layer 142, the third insulation layer 143, the interlayer insulating layer 160, the drain electrode 175, and the source electrode 173 are the same as the substrate 110, the buffer layer 120, the first gate electrode 150, the first insulation layer 141, the semiconductor layer 130, the second insulation layer 142, the third insulation layer 143, the interlayer insulating layer 160, the drain electrode 175, and the source electrode 173 described with reference to FIG. 1, and therefore only differences will be described.

Compared to the cross-sectional view of FIG. 1, the organic light emitting diode display shown in FIG. 5 does not include the second drain control gate electrode 154 and the second source control gate electrode 155. In the present example embodiment, the first drain control gate electrode 152 and the first source control gate electrode 153 may be disposed on the same layer and at opposite sides of the first gate electrode 150.

A virtual extension line extending perpendicularly from the top surface of the substrate 110 and passing an inner boundary of a LDD region may not intersect the first drain control gate electrode 152 or the first source control gate electrode 153.

In the present example embodiment, only the first LDD region 132 overlaps the first drain control gate electrode 152 and only the second LDD region 133 overlaps the first source control gate electrode 153, and they do not contact another region of the semiconductor layer. As a result, the drain control electrode 152 and the source control gate electrode 153 may control only the LDD regions, while hardly affecting other peripheral regions, which may improving a characteristic of the thin film transistor.

According to the present example embodiment, the source control gate electrodes and the drain control gate electrodes are additionally formed to reduce a leakage current, and therefore, an effect of a thin film transistor according to the present example embodiment will be observed when the thin film transistor is driven according to the above-described section (iii) of FIG. 3.

Referring back to FIG. 3, the positive voltage is applied to the first gate electrode 150 and the second gate electrode 151 to turn off the thin film transistor according to the present example embodiment, and electrons are gathered in the channel region 131 of the semiconductor layer 130 that is disposed between the first gate electrode 150 and the second gate electrode 151. In this case, a leakage current that flows to a drain region 134 from a source region 135 may occur, and thus a negative voltage may be applied to the first drain control gate electrode 152 and the first source control gate electrode 153 as shown in FIG. 5. Accordingly, only holes remain in the first LDD region 132 and the second LDD region 133, and thus electron flow of the channel region 131 is interrupted and thus no leakage current flowing to the drain region 134 from the source region 134 occurs.

In the thin film transistor of FIG. 5, the negative voltage is applied only to a single drain control gate electrode and a single source control gate electrode, unlike the structure shown in FIG. 2C, and thus intensity of a current that can be controlled according to the present example embodiment may be lower than intensity of the leakage current that can be controlled according to the present example embodiment of FIG. 2C.

Figure 6:
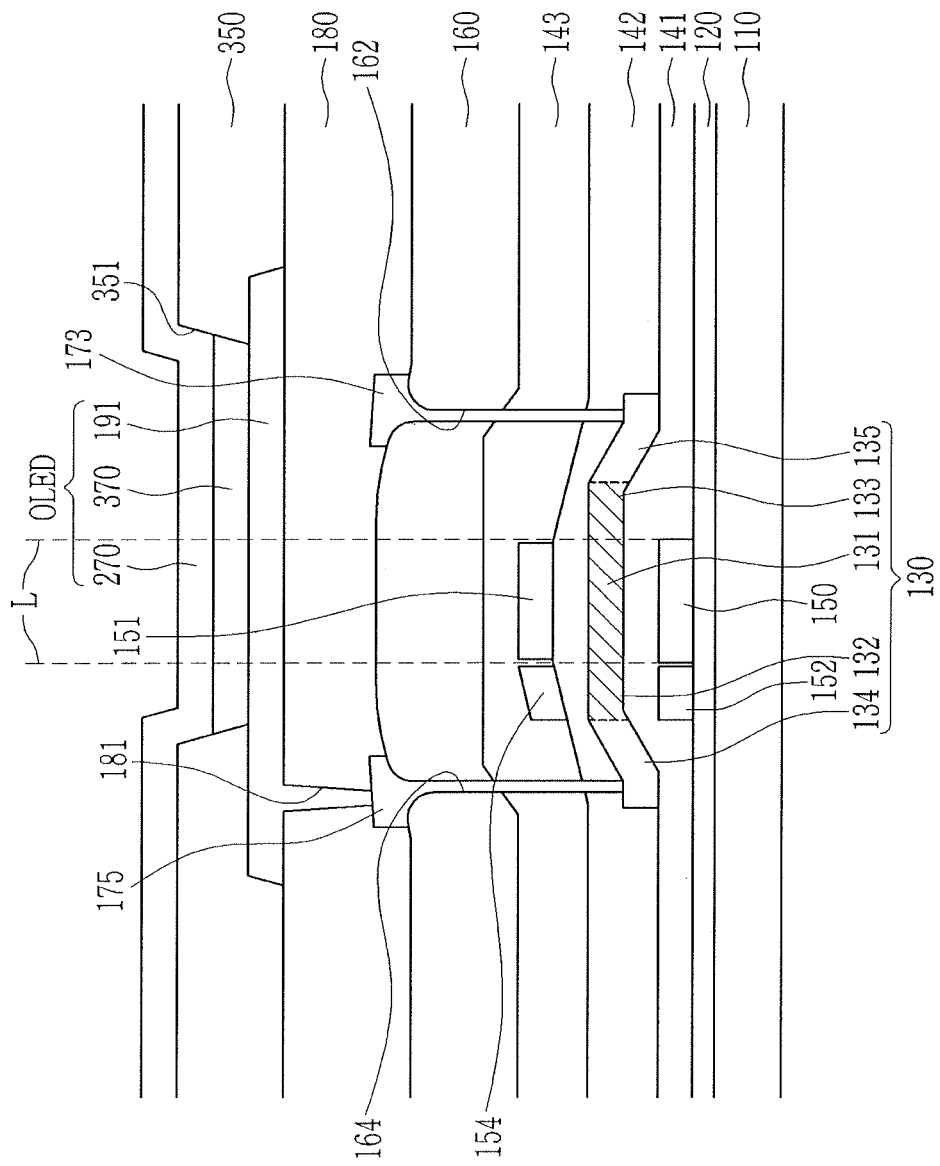
FIG. 6 illustrates a cross-sectional view of an organic light emitting diode display device according to another example embodiment.

FIG. 6 illustrates a cross-sectional view of an organic light emitting diode display according to another example embodiment.

Referring to FIG. 6, the organic light emitting diode display according to the present example embodiment includes a substrate 110, a buffer layer 120, a first gate electrode 150, a first drain control gate electrode 152, a first insulation layer 141, a semiconductor layer 130, a second insulation layer 142, a second gate electrode 151, the second drain control gate electrode 154, a third insulation layer 143, an interlayer insulating layer 160, a drain electrode 175, a source electrode 173, a passivation layer 180, a pixel electrode 191, a barrier rib 350, an organic emission layer 370, and a common electrode 270.

Here, the substrate 110, the buffer layer 120, the first gate electrode 150, the first insulation layer 141, the semiconductor layer 130, the second insulation layer 142, the third insulation layer 143, the interlayer insulating layer 160, the drain electrode 175, and the source electrode 173 respectively correspond to the substrate 110, the buffer layer 120, the first gate electrode 150, the first insulation layer 141, the semiconductor layer 130, the second insulation layer 142, the third insulation layer 143, the interlayer insulating layer 160, the drain electrode 175, and the source electrode 173 described with reference to FIG. 1, and therefore, only differences will be described.

Compared to the cross-sectional view of FIG. 1, the organic light emitting diode display shown in FIG. 6 does not include the first source control gate electrode 153 and the second source control gate electrode 155. In the organic light emitting diode display according to the present example embodiment, only the first drain control gate electrode 152 is provided at one side of the first gate electrode 150, and only the second drain control gate electrode 154 may be provided on the same layer as and at one side of the second gate electrode 151.

The first drain control gate electrode 152 and the second drain control gate electrode 154 overlap only the first LDD region 132, and do not overlap region of another semiconductor. As a result, the first drain control gate electrode and the second drain control gate electrode may control only the first LDD region, while hardly affecting other peripheral regions, which may improve a characteristic of the thin film transistor.

FIG. 6 shows only the drain control gate electrodes disposed at one side of each of the first gate electrode and the second gate electrode, but this is not restrictive, and only source control gate electrodes may be formed.

Figure 7:
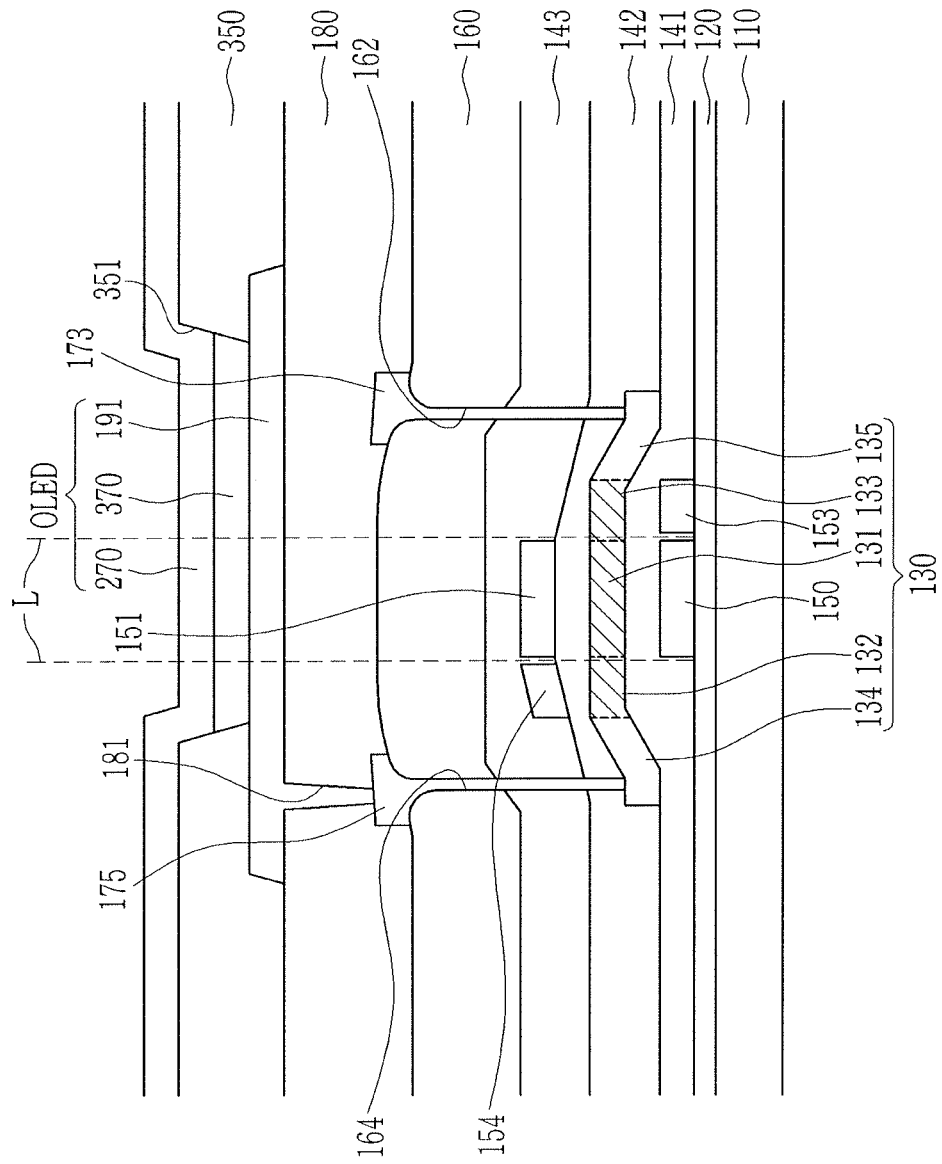
FIG. 7 illustrates a cross-sectional view of an organic light emitting diode display device according to another example embodiment.

FIG. 7 illustrates a cross-sectional view of an organic light emitting diode display according to another example embodiment.

Referring to FIG. 7, an organic light emitting diode display according to the present example embodiment includes a substrate 110, a buffer layer 120, a first gate electrode 150, the first source control gate electrode 153, a first insulation layer 141, a semiconductor layer 130, a second insulation layer 142, a second gate electrode 151, the second drain control gate electrode 154, a third insulation layer 143, an interlayer insulating layer 160, a drain electrode 175, a source electrode 173, a passivation layer 180, a pixel electrode 191, a barrier rib 350, an organic emission layer 370, and a common electrode 270.

Here, the substrate 110, the buffer layer 120, the first gate electrode 150, the first insulation layer 141, the semiconductor layer 130, the second insulation layer 142, the third insulation layer 143, the interlayer insulating layer 160, the drain electrode 175, and the source electrode 173 respectively correspond to the substrate 110, the buffer layer 120, the first gate electrode 150, the first insulation layer 141, the semiconductor layer 130, the second insulation layer 142, the third insulation layer 143, the interlayer insulating layer 160, the drain electrode 175, and the source electrode 173 of FIG. 1, and therefore only differences will be described.

Compared to the organic light emitting diode display shown in FIG. 1, the organic light emitting diode display shown in FIG. 7 does not include the first drain control gate electrode 152 and the second source control gate electrode 155, and only the first source control gate electrode 153 may be disposed at one side of the first gate electrode 150 and only the second drain control gate electrode 154 may be disposed at the other side of the second gate electrode 151.

The second drain control gate electrode 154 is disposed above the first LDD region 132, and the first source control gate 153 is disposed below the second LDD region 133.

FIG. 7 illustrates only the first source control gate electrode 153 disposed at one side of the first gate electrode 150 and only the second drain control gate electrode 154 disposed at the other side of the second gate electrode 151, but unlike the example embodiment of FIG. 7, only the first drain control gate electrode 152 may be disposed at one side of the first gate electrode 150 and only the second source control gate electrode 155 may be disposed at the other side of the second gate electrode 151.

FIG. 4 to FIG. 7 illustrate the drain control gate electrodes 152 and 154 and the source control gate electrodes 153 and 155 that only partially exist. They correspond to various example embodiments for prevention of occurrence of a leakage current when the thin film transistor is turned off, but compared to the example embodiment of FIG. 1, the occurrence of the leakage current may be less suppressed.

The thin film transistors shown in FIG. 1 to FIG. 7 correspond to a double-gate structure that includes the first gate electrode 150 and the second gate electrode 151. However, the drain control gate electrode and the source control gate electrode may also be realized in a structure that includes only one gate electrode, and accordingly, a structure that includes only one gate electrode will be described hereinafter.

Figure 8:
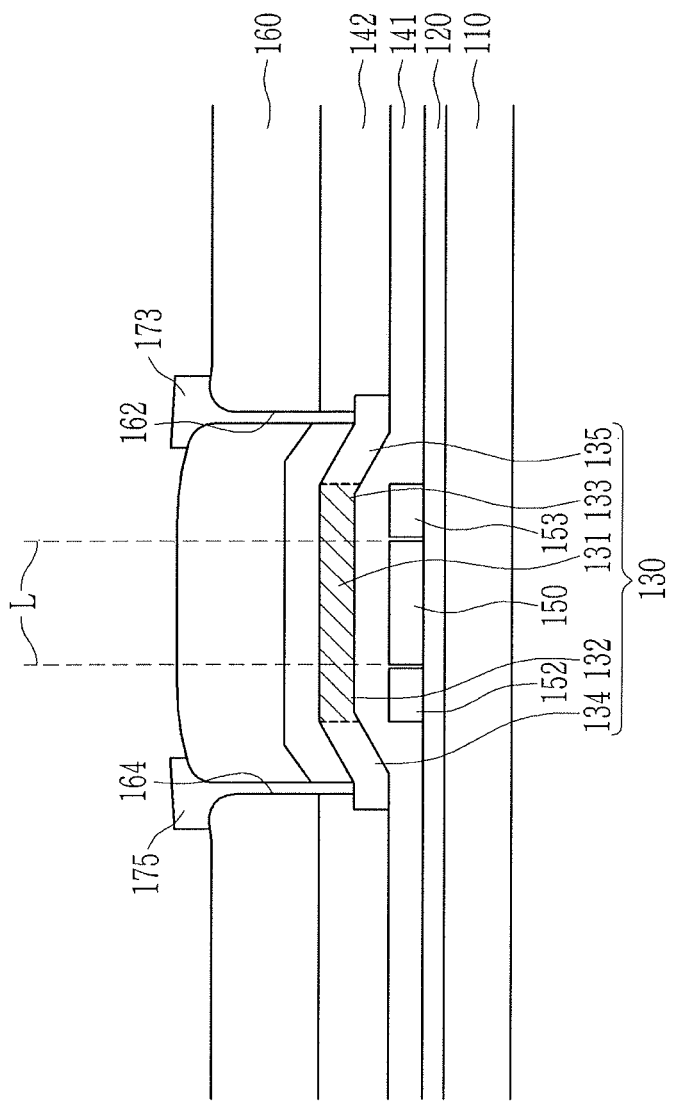
FIG. 8 illustrates a cross-sectional view of a thin film transistor array panel according to another example embodiment.

FIG. 8 illustrates a cross-sectional view of a thin film transistor array panel according to another example embodiment.

Referring to FIG. 8, a thin film transistor according to the present example embodiment includes a substrate 110, a buffer layer 120, a first gate electrode 150, a first drain control gate electrode 152, the first source control gate electrode 153, a first insulation layer 141, a semiconductor layer 130, a second insulation layer 142, an interlayer insulating layer 160, a source electrode 173, and a drain electrode 175.

Here, the substrate 110, the buffer layer 120, the first gate electrode 150, the first insulation layer 141, the semiconductor layer 130, the second insulation layer 142, the interlayer insulating layer 160, the drain electrode 175, and the source electrode 173 respectively correspond to the substrate 110, the buffer layer 120, the first gate electrode 150, the first insulation layer 141, the semiconductor layer 130, the second insulation layer 142, the interlayer insulating layer 160, the source electrode 173, and the drain electrode 175 described with reference to FIG. 1, and therefore only differences will be described.

The thin film transistor array panel shown in FIG. 8 has a bottom-gate structure that includes the first gate electrode 150.

In the thin film transistor array panel shown in FIG. 8, the first gate electrode 150 is disposed on the substrate 110 and the first insulation layer 141 is disposed on the first gate electrode 150. The thin film transistor array panel may include a structure in which the semiconductor layer 130 is disposed on the first insulation layer 141 and the second insulation layer is disposed on the semiconductor layer 130.

The first drain control gate electrode 152 and the first source control gate electrode 153 may be disposed on the same layer as the first gate electrode 150, and may be disposed between the substrate 110 and the first insulation layer 141.

The first drain control gate electrode 152 may overlap the first LDD region 132, and the first source control gate electrode 153 may overlap the second LDD region 133.

In addition, the first source control gate electrode 153 and the first drain control gate electrode 152 are disposed at a predetermined distance from each other at opposite sides of the first gate electrode 150, while disposing the first gate electrode 150 therebetween. The first gate electrode 150 may overlap a channel region 131.

A virtual extension line extending perpendicularly from the upper surface of the substrate 110 and passing an inner boundary of a LDD region may not intersect the second drain control gate electrode 154 and the second source control gate electrode 155.

In the present example embodiment, only the first LDD region 132 is disposed below the first drain control gate electrode 152, while overlapping the first drain control gate electrode 152, and only the second LDD region 133 is disposed below the first source control gate electrode 153, while overlapping the first source control gate electrode 153, and the drain control gate electrode 152 and the source control gate electrode 153 do not overlap another region of the semiconductor layer. As a result, the drain control gate electrode 152 and the source control gate electrode 153 may control only the LDD regions, while not affecting other peripheral areas, which may improve a characteristic of the thin film transistor.

The thin film transistor array panel according to the present example embodiment is exemplarily described as a P-type thin film transistor as previously described with reference to FIG. 1 to FIG. 7, and a driving method of the P-type thin film transistor will be described. However, the driving method is similarly applicable to an N-type thin film transistor.

Referring back to FIG. 3, a voltage applied to the first drain control gate electrode 152 and the first source control gate electrode 153 can be changed according to a voltage applied to the first gate electrode 150 to control a drain-source current in the sections (i), (ii), and (iii) of FIG. 3.

For example, in section (ii) of FIG. 3, a positive voltage is applied to the first gate electrode 150 to turn off the thin film transistor array panel according to the present example embodiment, and electrons are gathered in the channel region 131 of the semiconductor layer 130 disposed below the first gate electrode 150, while overlapping the first gate electrode 150. In this case, a leakage current that flows to the drain region 134 from the source region 135 may occur. In order to prevent occurrence of the leakage current, a negative voltage may be applied to the first drain control gate electrode 152 and the first source control gate electrode 153. Accordingly, only holes remain in the regions of the semiconductor layer 130 disposed below the first drain control gate electrode 152 and the first source control gate electrode 153, and accordingly, electron flow in the channel region 131 is interrupted, thereby preventing occurrence of the leakage current that flows to the drain region 134 from the source region 135.

Figure 9:
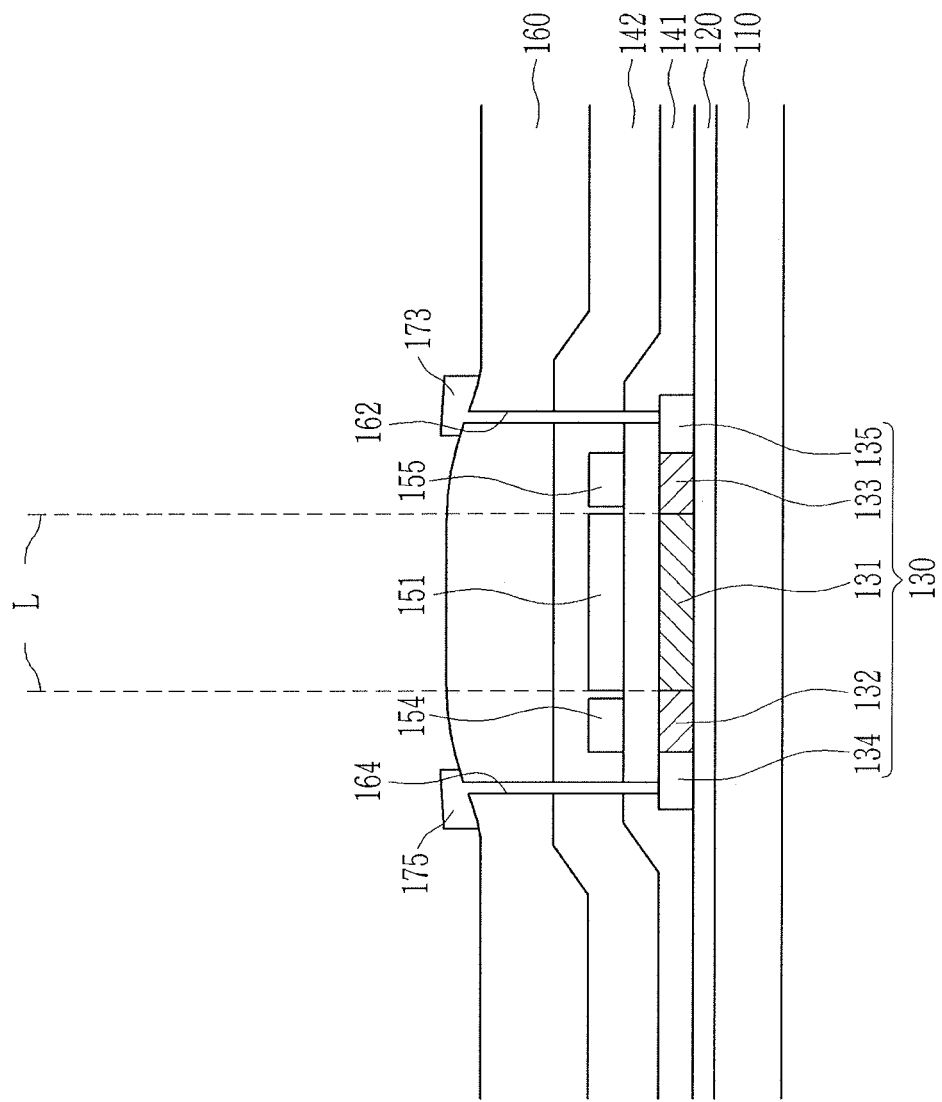
FIG. 9 illustrates a cross-sectional view of a thin film transistor array panel according to another example embodiment.

FIG. 9 illustrates a cross-sectional view of a thin film transistor array panel according to another example embodiment.

Compared to the thin film transistor array panel of FIG. 8, a thin film transistor array panel according to the present example embodiment of FIG. 9 includes a substrate 110, a buffer layer 120, a semiconductor layer 130, a first insulation layer 141, a second gate electrode 151, the second drain control gate electrode 154, a second source control gate electrode 155, a second insulation layer 142, an interlayer insulating layer 160, a drain electrode 175, and a source electrode 173.

The thin film transistor array panel of FIG. 9 includes a top-gate structure that includes the second gate electrode 151.

In the thin film transistor array panel shown in FIG. 9, the semiconductor layer 130 is disposed on the substrate 110, the first insulation layer 141 is disposed on the semiconductor layer 130, the second gate electrode 151 is disposed on the first insulation layer 141, and the second insulation layer 142 is disposed on the second gate electrode 151.

The second drain control gate electrode 154 and the second source control gate electrode 155 may be disposed on the same layer as the second gate electrode 151, and may be disposed between the first insulation layer 141 and the second insulation layer 142.

The second drain control gate electrode 154 is disposed while overlapping the first LDD region 132, and the second source control gate electrode 155 is disposed while overlapping the second LDD region 133, and not overlapping another region of the semiconductor layer.

In addition, the second source control gate electrode 154 and the second drain control gate electrode 155 may be disposed at a predetermined distance at opposite sides of the second gate electrode 151, while disposing the second gate electrode 151 therebetween, and accordingly, the second gate electrode 151 may overlap the channel region 131.

The thin film transistor array panel according to the present example embodiment is exemplarily provided as a P-type thin film transistor as previously described with reference to FIG. 1 to FIG. 7, and a driving method of the P-type thin film transistor will be described. However, the driving method is similarly applicable to an N-type thin film transistor.

Referring back to FIG. 3, a voltage applied to the second drain control gate electrode 154 and the second source control gate electrode 155 can be changed according to a voltage applied to the second gate electrode 151 to control a drain-source current in the sections (i), (ii), and (iii) of FIG. 3.

Referring back to FIG. 2A to FIG. 2C, when the voltage applied to the second drain control gate electrode 154 and the second source control gate electrode 155 of the thin film transistor array panel according to the present example embodiment of FIG. 9 is changed in the sections (i), (ii), and (iii), the leakage current may be reduced.

Figure 10:
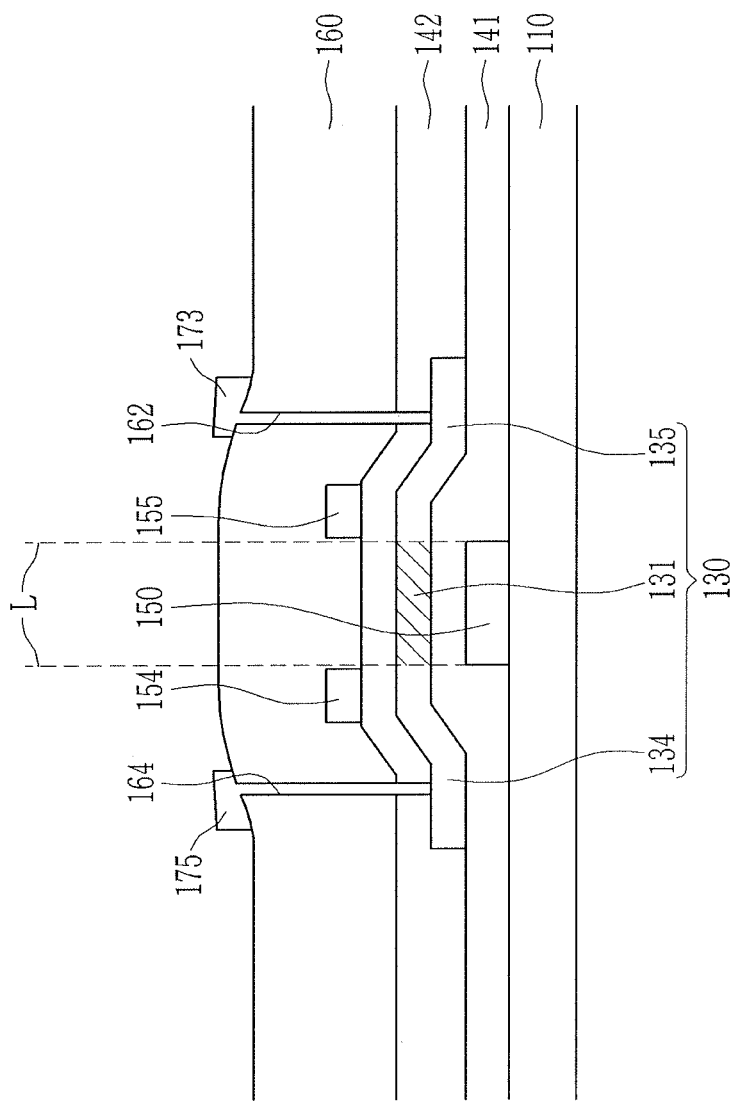
FIG. 10 illustrates a cross-sectional view of a thin film transistor array panel according to another example embodiment.

FIG. 10 illustrates a cross-sectional view of a thin film transistor array panel according to another example embodiment.

Referring to FIG. 10, the thin film transistor array panel according to the present example embodiment includes a substrate 110, a first gate electrode 150, a first insulation layer 141, a semiconductor layer 130, a second insulation layer 142, the second drain control gate electrode 154, a second source control gate electrode 155, an interlayer insulating layer 160, a source electrode 173, and a drain electrode 175.

The first gate electrode 150 is disposed on the substrate 110, the first insulation layer 141 is disposed on the first gate electrode 150, and the semiconductor layer 130 is disposed on the first insulation layer 141. In addition, the second insulation layer 142 is disposed on the semiconductor layer 130, and the second drain control gate electrode 154 and the second source control gate electrode 155 are disposed on the second insulation layer 142. The interlayer insulation layer 160, the source electrode 173, and the drain electrode 175 may be sequentially disposed on the control gate electrode.

The substrate 110 may be provided as an insulating substrate that is made of glass, quartz, ceramic, and the like, or may be made of stainless steel or provided as a flexible plastic material such as a polyimide film for realization of a flexible display device.

The first gate electrode 150 is disposed on the substrate 110, and may be provided as a multiple layer or a single layer formed of copper (Cu), molybdenum (Mo), aluminum (Al), titanium (Ti), and the like.

The first insulation layer 141 is disposed on the first gate electrode 150, while covering the first gate electrode 150 and the substrate 110, and may include a silicon nitride (SiNx) or silicon oxide (SiOx).

The semiconductor layer 130 is disposed on the first insulation layer 141, and may include an oxide semiconductor material.

The semiconductor layer 130 includes a channel region 131, a source region 135, and a drain region 134. Here, the semiconductor layer 130 is formed of an oxide instead of polycrystalline silicon and does not undergo a doping process, and therefore does not include a lightly doped drain (LDD) region having higher resistance than the source region 135 and the drain region 134.

The second insulation layer 142 is disposed on the semiconductor layer 130, while covering the first insulation layer 141 and the semiconductor layer 130, and may include a silicon nitride (SiNx).

The second drain control gate electrode 154 and the second source control gate electrode 155 are disposed on the second insulation layer 142, and do not overlap the first gate electrode 150 that is disposed below the first insulation layer 141. This is because the first gate electrode 150, the second drain control gate electrode 154, and the second source control gate electrode 155 are individually applied with a voltage to control intensity of a drain-source current.

The second drain control gate electrode 154 and the second source control gate electrode 155 may be provided as a multiple layer or a single layer formed of copper (Cu), molybdenum (Mo), aluminum (Al), titanium (Ti), and the like. In addition, the second drain control gate electrode 154 and the second source control gate electrode 155 may be made of a metal having higher resistivity than the source electrode 173 and the drain electrode 175.

The interlayer insulating layer 160 may be disposed on the second insulation layer 142, and contact holes 162 and 164 that expose at least a part of the semiconductor layer 130 are formed in the second insulation layer 142 and the interlayer insulating layer 160. The contact holes 162 and 164 particularly expose a contact doping area of the semiconductor layer 130.

The source electrode 173 and the drain electrode 175 may be disposed on the interlayer insulating layer 160. The source electrode 173 may be connected with the source region 135 through the contact hole 162, and the drain electrode 175 may be connected with the drain region 134 of the semiconductor layer 130 through the contact hole 164.

As described, the semiconductor layer 130, first gate electrode 150, the first drain control gate electrode 152, the first source control gate electrode 153, the second gate electrode 151, the second drain control gate electrode 154, the second source control gate electrode 155, and the source electrode 173, and the drain electrode 175 form a single thin film transistor. The thin film transistor may be, for example, a switching transistor, a driving transistor, or a compensation transistor.

The thin film transistor array panel according to the present example embodiment shown in FIG. 10 is an N type thin film transistor array panel formed of an oxide semiconductor, and is different from the thin film transistor array panel shown in FIG. 1 to FIG. 9 with respect to a voltage applied thereto and a type of a channel formed in the semiconductor, while both may have the same effect.

Unlike a P type thin film transistor, the N type thin film transistor according to the present example embodiment has a drain current that is increased as a gate-source voltage (Vgs) is increased. Thus, a positive voltage is applied to the first gate electrode 150 to turn on the N-type thin film transistor. In order to increase intensity of the current flowing to the thin film transistor, the same positive voltage may be applied to the second drain control gate electrode 154 and the second source control gate electrode 155. Accordingly, electrons are gathered on an upper surface of the channel region 131 of the semiconductor layer 130, overlapping below the control gate electrode, and the positive voltage is applied to the control gate electrodes 154 and 155 and thus a current path is formed in the channel region 131 to which a driving current flows such that the current can flow more effectively.

Meanwhile, a negative voltage is applied to the first gate electrode 150 to turn off the N-type thin film transistor array panel. Thus, in order to reduce a leakage current that occurs even through the transistor is turned off, the positive voltage, which having a different polarity, may be applied to the second drain control gate electrode 154 and the second source control gate electrode 155. Accordingly, electrons are gathered on the upper surface of the channel region 131 of the semiconductor layer 130, overlapping below the control gate electrodes 154 and 155, and thus a path formed by the first gate electrode 150 and through which holes of the channel region 131 can move is not connected due to the negative voltage of the control gate electrode such that no current flows. Accordingly, the driving current is increased when the thin film transistor according to the present example embodiment is turned on and the driving current is reduced when the thin film transistor is turned off, and this effect of the thin film transistor of FIG. 10 is the same as those of the thin film transistors of the example embodiments of FIG. 1 to FIG. 9.

By way of summation and review, an organic light emitting diode display may include a plurality of pixels, each including an organic light emitting diode as a self-emissive element, and each pixel may include one or more thin film transistors and one or more capacitors for driving the organic light emitting diode. The thin film transistors may include a switching transistor, a driving transistor, and the like. When a leakage current occurs in one of the thin film transistors, the organic light emitting diode that is set to display black may instead emit a slight amount of light.

As described above, embodiments relate to a display substrate that includes a thin film transistor that can be applied to an organic light emitting diode display and various other display devices. According to an embodiment, when the thin film transistor that includes a LDD region is turned on, a driving current is increased, and when the thin film transistor is turned off, the driving current is decreased, and accordingly, a leakage current of the thin film transistor may be reduced. According to an embodiment, the drain and source control gate electrodes control the LDD region of the semiconductor, which may improve a characteristic of the thin film transistor.

Embodiments may provide a thin film transistor array panel that may reduce a leakage current even when a thin film transistor that includes a LDD region is turned off, and various display devices including the thin film transistor array panel.

<Description of symbols>

| | |
|---|---|
| 110: substrate | 120: buffer layer |
| 130: semiconductor | 131: channel region |
| 132: first LDD region | 133: second LDD region |
| 134: drain region | 135: source region |
| 141: first insulation layer | 142: second insulation layer |
| 143: third insulation layer | |
| 150: first gate electrode | 151: second gate electrode |
| 152: first drain control gate electrode | |
| 153: first source control gate electrode | |
| 154: second drain control gate electrode | |
| 155: second source control gate electrode | |
| 160: interlayer insulating layer | 173: source electrode |
| 175: drain electrode | 180: passivation layer |
| 191: pixel electrode | 270: common electrode |
| 350: barrier rib | |

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A thin film transistor array panel, comprising:
    a substrate;
    a gate electrode on the substrate;
    a first control gate electrode and a second control gate electrode on a same layer as the gate electrode, the first control gate electrode and the second control gate electrode being respectively disposed at one side and the other side of the gate electrode, the first control gate electrode and the second control gate electrode being physically separated from, and disposed at a distance from, the gate electrode such that a voltage to the first control gate electrode and a voltage to the second control gate electrode can be independently applied from a voltage applied to the gate electrode;
    a semiconductor layer disposed above the gate electrode, the first control gate electrode, and the second control gate electrode, the semiconductor layer including a channel that overlaps the gate electrode, a drain region, a source region, a first lightly doped drain region that is disposed between the channel and the drain region and overlaps the first control gate electrode, and a second lightly doped drain region that is disposed between the channel and the source region and overlaps the second control gate electrode; and a source electrode and a drain electrode respectively connected with the source region and the drain region, wherein the gate electrode overlaps the first control gate electrode and the second control gate electrode in a direction parallel to one surface of the substrate.

2. The thin film transistor array panel as claimed in claim 1, further comprising:
a first insulation layer between the gate electrode and the semiconductor layer; and
a second insulation layer on the semiconductor layer.

3. The thin film transistor array panel as claimed in claim 1, further comprising:
a first insulation layer between the semiconductor layer and the gate electrode; and
a second insulation layer on the gate electrode.

4. The thin film transistor array panel as claimed in claim 1, wherein the source region and the drain region of the semiconductor layer are doped with a P-type impurity.

5. The thin film transistor array panel as claimed in claim 4, wherein
the first control gate electrode is a drain control gate electrode and the second control gate electrode is a source control gate electrode, and
in response to a voltage applied to the gate electrode being higher than a predetermined voltage, the drain control gate electrode and the source control gate electrode are each applied with a positive voltage independent of the voltage applied to the gate electrode.

6. The thin film transistor array panel as claimed in claim 5, wherein
in response to a voltage applied to the gate electrode being lower than a predetermined voltage, the drain control gate electrode and the source control gate electrode are each applied with a negative voltage independent of the voltage applied to the gate electrode.

7. A thin film transistor array panel, comprising:
a substrate;
a gate electrode on and over the substrate;
a semiconductor layer disposed on and over the gate electrode, the semiconductor layer including a source region, a drain region, and a channel region;
a control gate electrode on and over the semiconductor layer and disposed farther from the substrate than the semiconductor layer, no portion of the control gate electrode overlapping the gate electrode;
a source electrode and a drain electrode connected with the semiconductor layer, and
a pixel electrode on and over the source electrode.

8. The thin film transistor array panel as claimed in claim 7, further comprising:
a first insulation layer between the gate electrode and the semiconductor layer; and
a second insulation layer between the semiconductor layer and the control gate electrode.

9. The thin film transistor array panel as claimed in claim 7, wherein
in response to a voltage applied to the gate electrode being higher than a predetermined voltage, the control gate electrode is applied with a positive voltage.

10. The thin film transistor array panel as claimed in claim 9, wherein
in response to a voltage applied to the gate electrode being lower than a predetermined voltage, the control gate electrode is applied with a negative voltage.

11. The thin film transistor array panel as claimed in claim 7, wherein the control gate electrode is physically separated from the gate electrode such that a voltage to the control gate electrode can be independently applied from a voltage applied to the gate electrode.

12. The thin film transistor array panel as claimed in claim 7, wherein the gate electrode overlaps a center of the channel.

13. The thin film transistor array panel as claimed in claim 1, wherein the gate electrode overlaps a center of the channel.

14. The thin film transistor array panel as claimed in claim 7, wherein the control gate electrode overlaps a lightly doped drain region of the semiconductor layer.

* * * * *